(12) United States Patent
Huang et al.

(10) Patent No.: US 11,404,511 B2
(45) Date of Patent: Aug. 2, 2022

(54) ORGANIC LIGHT-EMITTING DISPLAY PANEL INCLUDING MOTH-EYE ANTI-REFLECTION LAYER, AND MANUFACTURING METHOD THEREOF

(71) Applicant: WUHAN CHINA STAR OPTOELECTRONICS SEMICONDUCTOR DISPLAY TECHNOLOGY CO., LTD., Hubei (CN)

(72) Inventors: Xiaowen Huang, Hubei (CN); Wenliang Gong, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 315 days.

(21) Appl. No.: 16/615,849

(22) PCT Filed: Aug. 6, 2019

(86) PCT No.: PCT/CN2019/099385
§ 371 (c)(1),
(2) Date: Nov. 22, 2019

(87) PCT Pub. No.: WO2020/252862
PCT Pub. Date: Dec. 24, 2020

(65) Prior Publication Data
US 2021/0335952 A1    Oct. 28, 2021

(30) Foreign Application Priority Data
Jun. 21, 2019 (CN) .......................... 201910541697.6

(51) Int. Cl.
*H01L 27/32* (2006.01)
*H01L 51/52* (2006.01)
*H01L 51/56* (2006.01)

(52) U.S. Cl.
CPC ...... *H01L 27/3262* (2013.01); *H01L 51/5237* (2013.01); *H01L 51/5281* (2013.01); *H01L 51/56* (2013.01)

(58) Field of Classification Search
CPC ............ H01L 27/3262; H01L 51/5237; H01L 51/5281; H01L 51/56
(Continued)

(56) References Cited

U.S. PATENT DOCUMENTS

2017/0090182 A1    3/2017 Steyn et al.
2020/0194728 A1*   6/2020 Kim ...................... G06F 3/044
2020/0227484 A1*   7/2020 Lin ..................... H01L 51/0096

FOREIGN PATENT DOCUMENTS

CN    207781604 U    8/2018
CN    109065754 A    12/2018
(Continued)

*Primary Examiner* — Matthew E. Gordon

(57) ABSTRACT

An organic light-emitting display panel includes a thin-film transistor layer, a light-emitting function layer, and a thin-film encapsulation layer which overlap sequentially, and a shading layer, a color film layer, and an anti-reflection layer. The shading layer is disposed on the thin-film encapsulation layer. The color film layer is disposed on the thin-film encapsulation layer. The color film layer includes a first color film layer, a second color film layer, and a third color film layer disposed at an interval from each other. The shading layer is disposed at intervals among the first color film layer, the second color film layer, and the third color film layer. The anti-reflection layer is disposed on at least one surface of the shading layer and the color film layer.

13 Claims, 6 Drawing Sheets

(58) Field of Classification Search
USPC .......................................................... 257/40
See application file for complete search history.

(56) References Cited

FOREIGN PATENT DOCUMENTS

| | | | |
|---|---|---|---|
| CN | 109785763 A | | 5/2019 |
| CN | 109860419 A | | 6/2019 |
| KR | 20100062203 A | * | 6/2010 |

* cited by examiner

ORGANIC LIGHT-EMITTING DISPLAY PANEL INCLUDING MOTH-EYE ANTI-REFLECTION LAYER, AND MANUFACTURING METHOD THEREOF

CROSS-REFERENCE TO RELATED APPLICATIONS

This application is a 371 U.S. National Stage of International Application No. PCT/CN2019/099385, filed on Aug. 6, 2019, which claims priority to Chinese Application No. 201910541697.6, filed on Jun. 21, 2019. The entire disclosures of the above applications are incorporated herein by reference.

BACKGROUND OF DISCLOSURE

1. Field of Disclosure

The present disclosure relates to the field of display technology, and more particularly, to an organic light-emitting display panel.

2. Description of Related Art

Currently, in order to reduce the reflectivity of a display panel under the glare effectively, a polarizer is usually disposed in the display panel. However, light-emitting efficiency of the display panel is reduced by about 58% due to the polarizer, thereby shortening lifetimes of display devices.

In addition, because material composition of the polarizer includes polyvinyl alcohol (PVA) and because the thickness of the polarizer is greater, the polarizer is prone to break in a bending process. Thus, conventional display panels are not conducive to the development of flexible display technology.

SUMMARY

A technical problem is that, in order to reduce the reflectivity of a display panel under the glare effectively, a polarizer is usually disposed in the display panel; however, light-emitting efficiency of the display panel is reduced by about 58% due to the polarizer, thereby shortening lifetimes of display devices.

The object of the present disclosure is to provide an organic light-emitting display panel and a manufacturing method thereof, which can reduce the reflectivity effectively and also improve the light-emitting efficiency.

In order to realize the above object, the present disclosure provides an organic light-emitting display panel, including: a thin-film transistor layer, a light-emitting function layer, and a thin-film encapsulation layer which overlap sequentially; a shading layer disposed on the thin-film encapsulation layer; a color film layer disposed on the thin-film encapsulation layer, wherein the color film layer includes a first color film layer, a second color film layer, and a third color film layer disposed at an interval from each other, and wherein the shading layer is disposed at intervals among the first color film layer, the second color film layer, and the third color film layer; and an anti-reflection layer disposed on at least one surface of the shading layer and the color film layer, wherein the anti-reflection layer has an uneven surface and is of a moth-eye structure including a plurality of nano-scale protrusions.

In some embodiments, each of the plurality of nano-scale protrusions has a section of a cone, a semicircle, or a column.

In some embodiments, each of the plurality of nano-scale protrusions has a height of between 100 nanometers and 300 nanometers, and a distance between the plurality of nano-scale protrusions is between 50 nanometers and 300 nanometers.

In order to realize the above object, the present disclosure further provides an organic light-emitting display panel, including: a thin-film transistor layer, a light-emitting function layer, and a thin-film encapsulation layer which overlap sequentially; a shading layer disposed on the thin-film encapsulation layer; a color film layer disposed on the thin-film encapsulation layer, wherein the color film layer includes a first color film layer, a second color film layer, and a third color film layer disposed at an interval from each other, and wherein the shading layer is disposed at intervals among the first color film layer, the second color film layer, and the third color film layer; and an anti-reflection layer disposed on at least one surface of the shading layer and the color film layer.

In some embodiments, the color film layer is disposed on the thin-film encapsulation layer and on a part of the shading layer.

In some embodiments, the shading layer is disposed on the thin-film encapsulation layer and on a part of the color film layer.

In some embodiments, the anti-reflection layer has an uneven surface.

In some embodiments, the anti-reflection layer is of a moth-eye structure including a plurality of nano-scale protrusions.

In some embodiments, each of the plurality of nano-scale protrusions has a section of a cone, a semicircle, or a column.

In some embodiments, each of the plurality of nano-scale protrusions has a height of between 100 nanometers and 300 nanometers, and a distance between the plurality of nano-scale protrusions is between 50 nanometers and 300 nanometers.

In order to realize the above object, the present disclosure further provides a method of manufacturing an organic light-emitting display panel, including: providing a thin-film transistor layer, a light-emitting function layer, and a thin-film encapsulation layer which overlap sequentially; forming a light-filter assembly on the thin-film encapsulation layer, wherein the light-filter assembly includes a shading layer and a color film layer; and applying a plasma surface treatment to the light-filter assembly to form an anti-reflection layer.

In some embodiments, the step of forming the light-filter assembly includes: forming the shading layer on the thin-film encapsulation layer, wherein a plurality of sub-pixel areas are defined on the thin-film encapsulation layer by the shading layer; and forming the color film layer in the plurality of sub-pixel areas on the thin-film encapsulation layer.

In some embodiments, the step of forming the light-filter assembly includes: forming the color film layer in a plurality of sub-pixel areas on the thin-film encapsulation layer; and forming the shading layer between the plurality of sub-pixel areas on the thin-film encapsulation layer.

The beneficial effect of the present disclosure is that, an organic light-emitting display panel and a manufacturing method thereof are provided, which can reduce the reflectivity effectively and also improve the light-emitting efficiency.

BRIEF DESCRIPTION OF DRAWINGS

To ensure the features and the technical content of the disclosure are more apparent and easier to understand, please refer to the explanation and the accompanying drawings of the disclosure as follows. However, the accompanying drawings are merely for reference without limiting the disclosure.

DETAILED DESCRIPTION OF EMBODIMENTS

To ensure the objects, the technical solutions, and the effects of the disclosure are clearer and more specific, the disclosure will be explained in conjunction with the accompanying drawings in detail further below. It should be understood that the embodiments described herein are merely a part of the embodiments of the present disclosure instead of all of the embodiments and are not used to limit the disclosure.

Figure 1A:
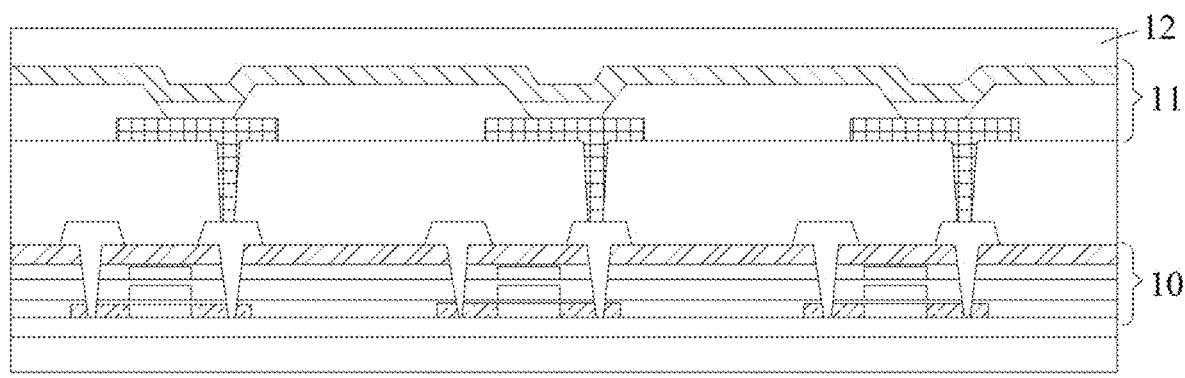
FIGS. 1A-1C are partially cross-sectional views of applying a method of manufacturing an organic light-emitting display panel according to a first embodiment of the present disclosure.
Figure 1B:
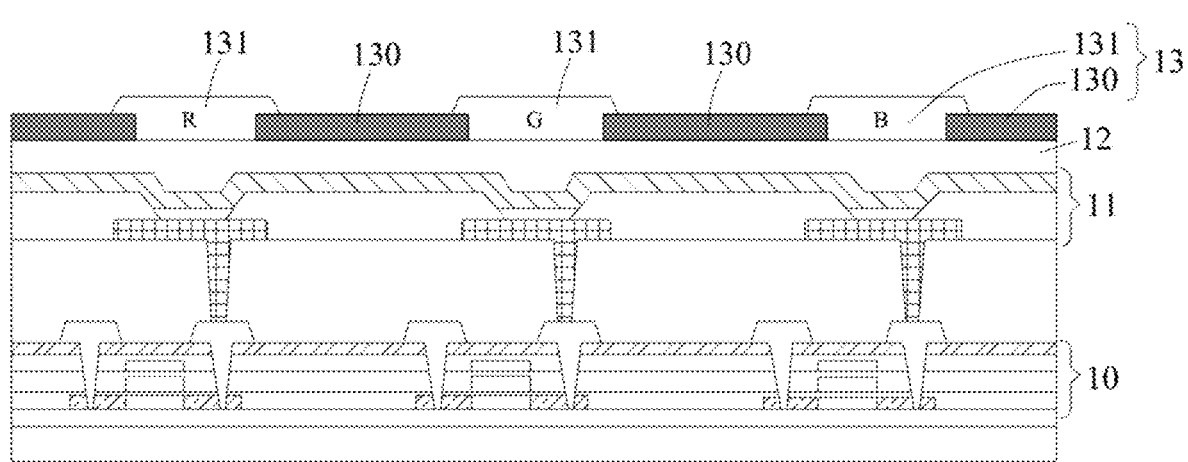
Figure 1C:
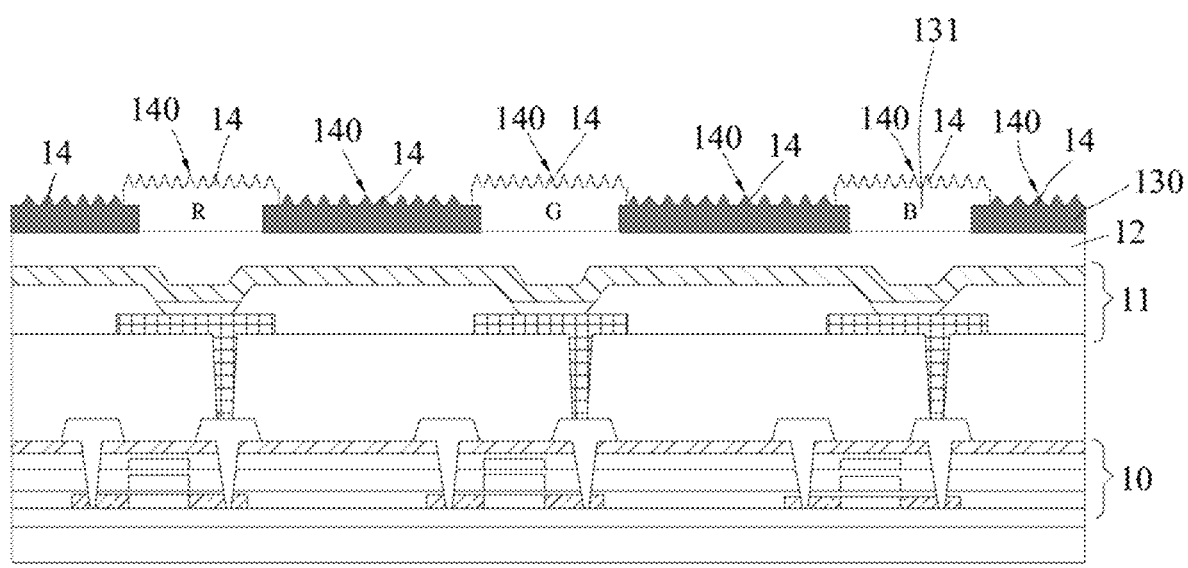

Please refer to FIGS. 1A-1C, which are partially cross-sectional views of applying a method of manufacturing an organic light-emitting display panel according to a first embodiment of the present disclosure. In the present disclosure, the method of manufacturing the organic light-emitting display panel includes the following steps:

First, as shown in FIG. 1A, providing a thin-film transistor layer 10, a light-emitting function layer 11, and a thin-film encapsulation layer 12 which overlap sequentially.

Next, as shown in FIG. 1B, forming a light-filter assembly 13 on the thin-film encapsulation layer 12. The light-filter assembly 13 includes a shading layer 130 and a color film layer 131. In the present embodiment, first, forming the shading layer 130 on the thin-film encapsulation layer 12, so that a plurality of sub-pixel areas are defined on the thin-film encapsulation layer 12 by the shading layer 130; then, forming the color film layer 131 in the plurality of sub-pixel areas on the thin-film encapsulation layer 12. As shown in FIG. 1B, the shading layer 130 is disposed on the thin-film encapsulation layer 12, and the color film layer 131 is disposed on the thin-film encapsulation layer 12 and on a part of the shading layer 130. Specifically, the color film layer 131 includes a first color film layer R, a second color film layer G, and a third color film layer B disposed at an interval from each other. The shading layer 130 is a black matrix. The shading layer 130 is disposed at intervals among the first color film layer R, the second color film layer G, and the third color film layer B.

Lastly, as shown in FIG. 1C, applying a plasma surface treatment to the light-filter assembly 13 to form an anti-reflection layer 14. In the present embodiment, applying the plasma surface treatment to the shading layer 130 and the color film layer 131 to form the anti-reflection layer 14 on surfaces of the shading layer 130 and the color film layer 131. As shown in FIG. 1C, the anti-reflection layer 14 is disposed on at least one surface of the shading layer 130 and the color film layer 131 through the plasma surface treatment. The anti-reflection layer 14 has an uneven surface which can reduce the reflection of light effectively and also increase transmittance, thereby improving light-emitting efficiency of the organic light-emitting display panel. In some embodiments, the anti-reflection layer 14 is of a moth-eye structure including a plurality of nano-scale protrusions. Furthermore, each of the plurality of nano-scale protrusions has a section of a cone, a semicircle, or a column. Specifically, each of the plurality of nano-scale protrusions has a height of between 100 nanometers and 300 nanometers, and a distance between the plurality of nano-scale protrusions is between 50 nanometers and 300 nanometers.

Figure 2A:
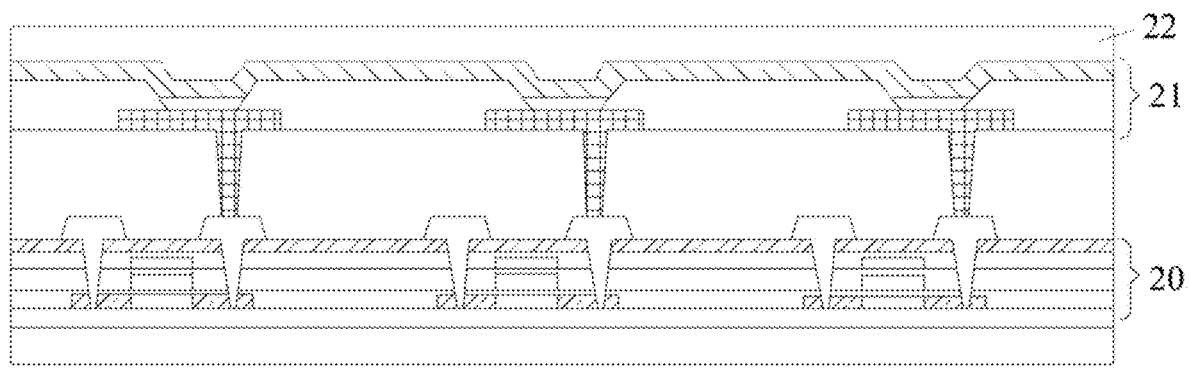
FIGS. 2A-2C are partially cross-sectional views of applying a method of manufacturing an organic light-emitting display panel according to a second embodiment of the present disclosure.
Figure 2B:
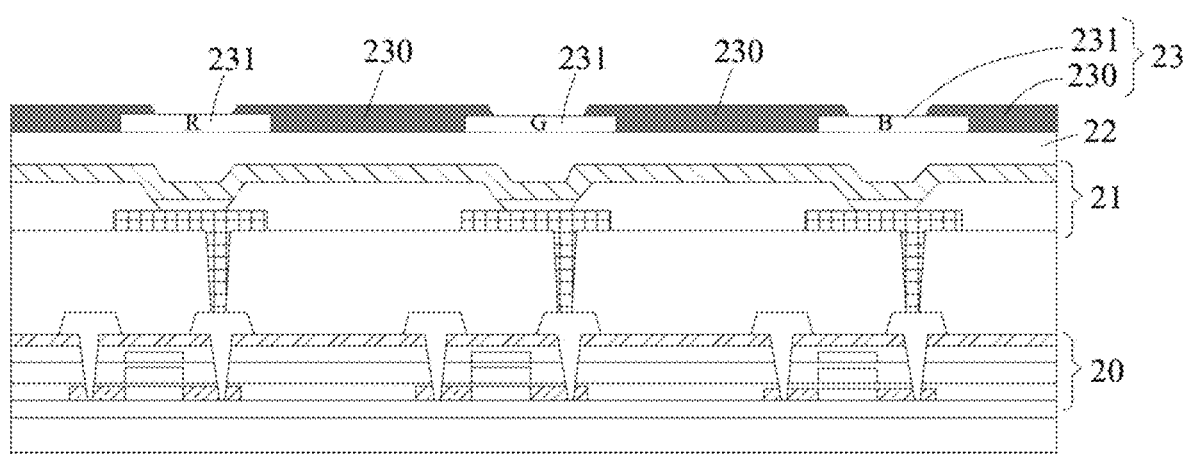
Figure 2C:
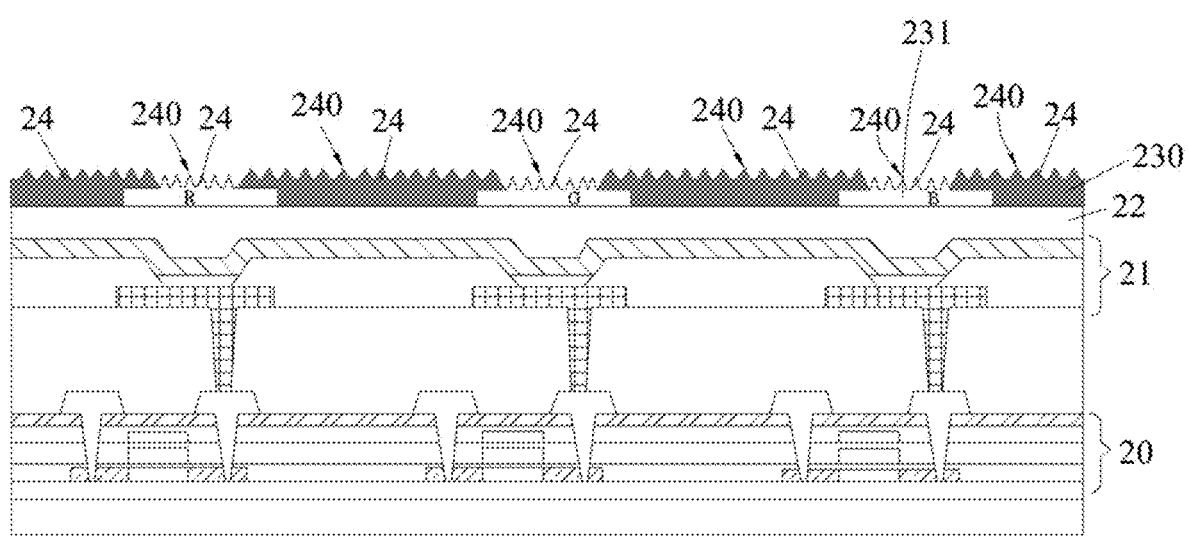

Please refer to FIGS. 2A-2C, which are partially cross-sectional views of applying a method of manufacturing an organic light-emitting display panel according to a second embodiment of the present disclosure. In the present disclosure, the method of manufacturing the organic light-emitting display panel includes the following steps:

First, as shown in FIG. 2A, providing a thin-film transistor layer 20, a light-emitting function layer 21, and a thin-film encapsulation layer 22 which overlap sequentially.

Next, as shown in FIG. 2B, forming a light-filter assembly 23 on the thin-film encapsulation layer 22. The light-filter assembly 23 includes a shading layer 230 and a color film layer 231. In the present embodiment, first, forming the color film layer 231 in a plurality of sub-pixel areas on the thin-film encapsulation layer 22; then, forming the shading layer 230 between the plurality of sub-pixel areas on the thin-film encapsulation layer 22. As shown in FIG. 2B, the color film layer 231 is disposed on the thin-film encapsulation layer 22, and the shading layer 230 is disposed on the thin-film encapsulation layer 22 and on a part of the color film layer 231. Specifically, the color film layer 231 includes a first color film layer R, a second color film layer G, and a third color film layer B disposed at an interval from each other. The shading layer 230 is a black matrix. The shading layer 230 is disposed at intervals among the first color film layer R, the second color film layer G, and the third color film layer B.

Lastly, as shown in FIG. 2C, applying a plasma surface treatment to the light-filter assembly 23 to form an anti-reflection layer 24. In the present embodiment, applying the plasma surface treatment to the shading layer 230 and the color film layer 231 to form the anti-reflection layer 24 on surfaces of the shading layer 230 and the color film layer 231. As shown in FIG. 2C, the anti-reflection layer 24 is disposed on at least one surface of the shading layer 230 and the color film layer 231 through the plasma surface treatment. The anti-reflection layer 24 has an uneven surface which can reduce the reflection of light effectively and also increase transmittance, thereby improving light-emitting efficiency of the organic light-emitting display panel. In some embodiments, the anti-reflection layer 24 is of a moth-eye structure including a plurality of nano-scale protrusions. Furthermore, each of the plurality of nano-scale protrusions has a section of a cone, a semicircle, or a column. Specifically, each of the plurality of nano-scale protrusions has a height of between 100 nanometers and 300 nanometers, and a distance between the plurality of nano-scale protrusions is between 50 nanometers and 300 nanometers.

In conclusion, the present disclosure provides an organic light-emitting display panel and a manufacturing method thereof mainly by applying the plasma surface treatment to the light-filter assembly, so that the reflectivity can be reduced effectively, and the light-emitting efficiency is also improved.

It should be understood that the application of the present disclosure is not limited by the foregoing examples. A person of ordinary skill in the art is able to make modifications or changes based on the foregoing description, and all of these modifications and changes are within the scope of the appended claims of the present disclosure.

The industrial applicability of the present disclosure is that, the organic light-emitting display panel and the manufacturing method thereof provided in the present disclosure can reduce the reflectivity effectively and also improve the light-emitting efficiency.

What is claimed is:

1. An organic light-emitting display panel, comprising:
   a thin-film transistor layer, a light-emitting function layer, and a thin-film encapsulation layer which overlap sequentially;
   a shading layer disposed on the thin-film encapsulation layer;
   a color film layer disposed on the thin-film encapsulation layer, wherein the color film layer comprises a first color film layer, a second color film layer, and a third color film layer disposed at an interval from each other, and wherein the shading layer is disposed at intervals among the first color film layer, the second color film layer, and the third color film layer; and
   an anti-reflection layer disposed on at least one surface of the shading layer and the color film layer, wherein the anti-reflection layer is composed of a plasma treated portion of the shading layer and a plasma treated portion of the color film layer, and has an uneven surface and is of a moth-eye structure comprising a plurality of nano-scale protrusions.

2. The organic light-emitting display panel of claim 1, wherein each of the plurality of nano-scale protrusions has a section of a cone, a semicircle, or a column.

3. The organic light-emitting display panel of claim 1, wherein each of the plurality of nano-scale protrusions has a height of between 100 nanometers and 300 nanometers, and a distance between the plurality of nano-scale protrusions is between 50 nanometers and 300 nanometers.

4. An organic light-emitting display panel, comprising:
   a thin-film transistor layer, a light-emitting function layer, and a thin-film encapsulation layer which overlap sequentially;
   a shading layer disposed on the thin-film encapsulation layer;
   a color film layer disposed on the thin-film encapsulation layer, wherein the color film layer comprises a first color film layer, a second color film layer, and a third color film layer disposed at an interval from each other, and wherein the shading layer is disposed at intervals among the first color film layer, the second color film layer, and the third color film layer; and
   an anti-reflection layer disposed on at least one surface of the shading layer and the color film layer, wherein the anti-reflection layer is composed of a plasma treated portion of the shading layer and the color film layer.

5. The organic light-emitting display panel of claim 4, wherein the color film layer is disposed on the thin-film encapsulation layer and on a part of the shading layer.

6. The organic light-emitting display panel of claim 4, wherein the shading layer is disposed on the thin-film encapsulation layer and on a part of the color film layer.

7. The organic light-emitting display panel of claim 4, wherein the anti-reflection layer has an uneven surface.

8. The organic light-emitting display panel of claim 4, wherein the anti-reflection layer is of a moth-eye structure comprising a plurality of nano-scale protrusions.

9. The organic light-emitting display panel of claim 8, wherein each of the plurality of nano-scale protrusions has a section of a cone, a semicircle, or a column.

10. The organic light-emitting display panel of claim 8, wherein each of the plurality of nano-scale protrusions has a height of between 100 nanometers and 300 nanometers, and a distance between the plurality of nano-scale protrusions is between 50 nanometers and 300 nanometers.

11. A method of manufacturing an organic light-emitting display panel, comprising:
    providing a thin-film transistor layer, a light-emitting function layer, and a thin-film encapsulation layer which overlap sequentially;
    forming a light-filter assembly on the thin-film encapsulation layer, wherein the light-filter assembly comprises a shading layer and a color film layer; and
    applying a plasma surface treatment to an exposed surface of the shading layer and the color film layer of the light-filter assembly to form an anti-reflection layer, wherein the anti-reflection layer is composed of a plasma treated portion of the shading layer and a plasma treated portion of the color film layer.

12. The method of claim 11, wherein the step of forming the light-filter assembly comprises:
    forming the shading layer on the thin-film encapsulation layer, wherein a plurality of sub-pixel areas are defined on the thin-film encapsulation layer by the shading layer; and
    forming the color film layer in the plurality of sub-pixel areas on the thin-film encapsulation layer.

13. The method of claim 11, wherein the step of forming the light-filter assembly comprises:
    forming the color film layer in a plurality of sub-pixel areas on the thin-film encapsulation layer; and
    forming the shading layer between the plurality of sub-pixel areas on the thin-film encapsulation layer.

* * * * *